United States Patent
Liu et al.

(10) Patent No.: US 9,000,345 B2
(45) Date of Patent: Apr. 7, 2015

(54) AMBIENT LIGHT SENSING MODULE WITH SIGNAL GENERATION FUNCTION

(75) Inventors: Ming-Huang Liu, Jhubei (TW); Meng-Yung Lin, Jhubei (TW)

(73) Assignee: Sitronix Technology Corp., Hsinchu County (TW)

( * ) Notice: Subject to any disclaimer, the term of this patent is extended or adjusted under 35 U.S.C. 154(b) by 895 days.

(21) Appl. No.: 13/116,052

(22) Filed: May 26, 2011

(65) Prior Publication Data
US 2011/0290987 A1 Dec. 1, 2011

Related U.S. Application Data

(60) Provisional application No. 61/348,383, filed on May 26, 2010.

(51) Int. Cl.
| | |
|---|---|
| G01J 1/44 | (2006.01) |
| G01J 1/46 | (2006.01) |
| G01J 1/42 | (2006.01) |
| H03K 4/50 | (2006.01) |
| H03K 7/08 | (2006.01) |
| H03M 1/50 | (2006.01) |

(52) U.S. Cl.
CPC ............... *G01J 1/46* (2013.01); *G01J 1/4204* (2013.01); *H03K 4/50* (2013.01); *H03K 7/08* (2013.01); *H03M 1/504* (2013.01)

(58) Field of Classification Search
CPC ............... G01J 1/46; G01J 1/44; G01J 1/00; G01J 1/10; G01J 1/16; G01J 1/18; G01J 1/42; G01J 1/4204; G01J 1/32; G01J 1/26; H03M 1/504; H03K 7/08; H03K 4/50
USPC ...... 250/214 R, 214 AL, 559.39, 206, 214 B, 250/214 C, 214 DC; 340/540, 555, 600; 348/602, 603, 366, 227.1; 396/98, 289; 356/213, 217, 221, 218, 227, 229–232, 356/228; 341/155, 157, 120
See application file for complete search history.

(56) References Cited

U.S. PATENT DOCUMENTS

| | | | | |
|---|---|---|---|---|
| 4,514,727 | A | * | 4/1985 | Van Antwerp ................ 345/691 |
| 4,800,442 | A | * | 1/1989 | Riseman et al. ............. 358/3.12 |

(Continued)

FOREIGN PATENT DOCUMENTS

TW 200908794 A 2/2009

*Primary Examiner* — Que T Le
*Assistant Examiner* — Jennifer Bennett
(74) *Attorney, Agent, or Firm* — Rosenberg, Klein & Lee

(57) ABSTRACT

The present invention provides an ambient light sensing module, which comprises a sawtooth signal generating circuit, an optical sensing unit, and a comparing unit. The sawtooth signal generating circuit produces a sawtooth signal. The optical sensing unit senses a light source and produces a light-sensing signal. The comparing unit produces a pulse-width modulation (PWM) signal related to the intensity of the light source according to the light-sensing signal and the sawtooth signal so that the PWM signal can be used as the control signal of the electronic device. The ambient light sensing module further comprises at least a fuse for determining a processing parameter. A signal processing unit processes the light-sensing signal according to the processing parameter for outputting a converting signal. The comparing unit compares the converting signal with the sawtooth signal for producing the PWM signal. An adjusting unit produces an adjusting signal according to the PWM signal and the light intensity or according to the converting signal and the light intensity for controlling a trimming unit to trim the fuse and thus modifying the processing parameter.

24 Claims, 9 Drawing Sheets

(56) References Cited

U.S. PATENT DOCUMENTS

| | | | |
|---|---|---|---|
| 4,864,419 A * | 9/1989 | Saito et al. | 358/300 |
| 5,095,203 A * | 3/1992 | Sato et al. | 250/222.1 |
| 5,336,882 A * | 8/1994 | Fooks et al. | 250/221 |
| 6,987,406 B1 * | 1/2006 | Chiu | 327/156 |
| 8,264,394 B2 * | 9/2012 | Liu | 341/166 |
| 2004/0227549 A1 * | 11/2004 | Solie | 327/131 |
| 2005/0199784 A1 * | 9/2005 | Jaffar et al. | 250/214 R |

* cited by examiner

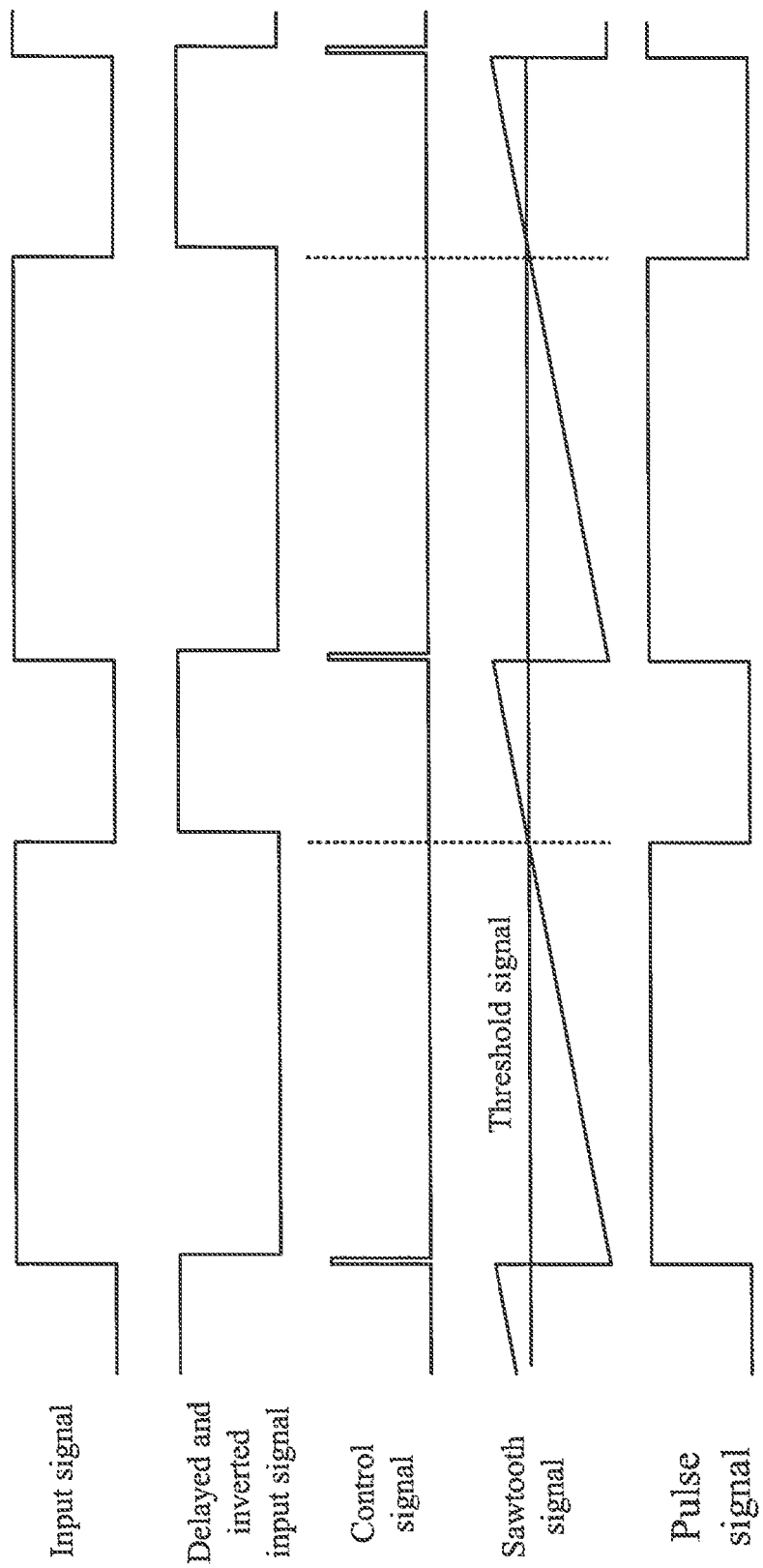

AMBIENT LIGHT SENSING MODULE WITH SIGNAL GENERATION FUNCTION

FIELD OF THE INVENTION

The present invention relates generally to a sensing module, and particularly to an ambient light sensing module for sensing the light intensity.

BACKGROUND OF THE INVENTION

Presently, thanks to progress in technologies, many electronic devices are developed for satisfying people's demands. For providing people with more convenience in lives, electronic devices with increasingly stronger functionality are introduced. In order to enhance functions of electronic devices, ambient light sensors are disposed for sensing the light intensity in the environment and hence executing the corresponding functions such as adjusting the light intensity of the backlight module of an electronic device or telling the user the light intensity in the environment. In addition, ambient light sensors can be disposed in cameras so that the flashlight can be activated automatically once the environmental light intensity is insufficient. Thereby, it is known from the above that the applications of ambient light sensors are becoming wide-spreading.

After an ambient light sensor senses light, it can produce a corresponding light-sensing signal according to the light intensity. The characteristics of the light-sensing signal vary according to different light intensity. For example, the amplitude of the light-sensing signal changes as the light intensity varies. When the light intensity is strong, the amplitude of the light-sensing signal is high. On the contrary, when the light intensity is weak, the amplitude of the light-sensing signal is low. Thereby, the back-stage circuit of an electronic device can know the light intensity according to the characteristics of the light-sensing signal for executing the corresponding functions. Nonetheless, the light-sensing signal output by a modern ambient light sensor cannot be used directly for controlling the back-stage circuit of the electronic device. The electronic device needs to process the light-sensing signal before it can control the back-stage circuit. Consequently, the burden and cost of the electronic device are increased.

Besides, due to material and process factors, the characteristics of different ambient light sensors vary. Even the characteristics of ambient light sensors manufactured using identical materials and processes may not be completely identical. Thereby, while sensing the same light source using different ambient light sensors, the light-sensing signals output by these ambient light sensors differ, which causes an electronic device unable to know the light intensity of the light source with accuracy and hence unable to execute the corresponding functions accurately. Even worse, erroneous functions might be executed instead. For instance, a camera might activate its flashlight even under sufficient light. Based on the above description, it is known that modern electronic devices are influenced by the not-completely-identical characteristics of their ambient light sensors, which may lead to deterioration of their performance.

Accordingly, the present invention provides an ambient light sensing module for solving the problem described above. The present invention can produce a pulse-width modulation (PWM) signal related to the light intensity as the control signal of an electronic device for improving the drawbacks according to the prior art. In addition, the characteristics of the ambient light sensing module according to the present invention can be trimmed and thus enhancing the accuracy of the ambient light sensing module.

SUMMARY

An objective of the present invention is to provide an ambient light sensing module, which senses the light intensity and produces a PWM signal related to the light intensity. The PWM signal can be the control signal of an electronic device directly for controlling the back-stage circuitry of the electronic device.

Another objective of the present invention is to provide an ambient light sensing module, which has at least a fuse for determining the processing parameters of the ambient light sensing module. The processing parameters can be modified by trimming the fuse via a trimming unit for adjusting the characteristics of the ambient light sensing module. Hence, the accuracy of the ambient light sensing module can be improved.

The ambient light sensing module according to the present invention comprises a sawtooth signal generating circuit, an optical sensing unit, and a comparing unit. The sawtooth signal generating circuit is used for producing a sawtooth signal; the optical sensing unit is used for sensing a light source for producing a light-sensing signal; the comparing unit produces a PWM signal according to the light-sensing signal and the sawtooth signal. The PWM signal is related to the light intensity. Because the ambient light sensing module according to the present invention can sense the intensity of the light source and produces the corresponding PWM signal, the PWM signal can be used as the control signal of the electronic device directly for controlling the back-stage circuitry thereof.

The present invention provides another ambient light sensing module, which comprises at least a fuse, an optical sensing unit, a signal processing circuit, and an adjusting unit. The fuse is used for determining a processing parameter; the optical sensing unit is used for sensing a light source and producing a light-sensing signal; the signal processing circuit processes the light-sensing signal and produces an output signal according to the processing parameter; the adjusting unit produces an adjusting signal according to the output signal and the intensity of the light source for controlling a trimming unit for trimming the fuse and thus modifying the processing parameter.

The present invention provides still another ambient light sensing module, which comprises at least a fuse, an optical sensing unit, a signal processing circuit, and an adjusting unit. The fuse is used for determining a processing parameter; the optical sensing unit is used for sensing a light source and producing a light-sensing signal; the signal processing circuit processes the light-sensing signal and produces an output signal according to the processing parameter; the adjusting unit produces a plurality of testing parameters according to the output signal and the intensity of the light source and produces a plurality of reference signals. The adjusting unit produces an adjusting signal according to the plurality of reference signals and the intensity of the light source for controlling a trimming unit for trimming the fuse and thus modifying the processing parameter.

BRIEF DESCRIPTION OF THE DRAWINGS

FIGS. 7A and 7B show waveforms of signals of a sawtooth signal generating circuit according to an embodiment of the present invention.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
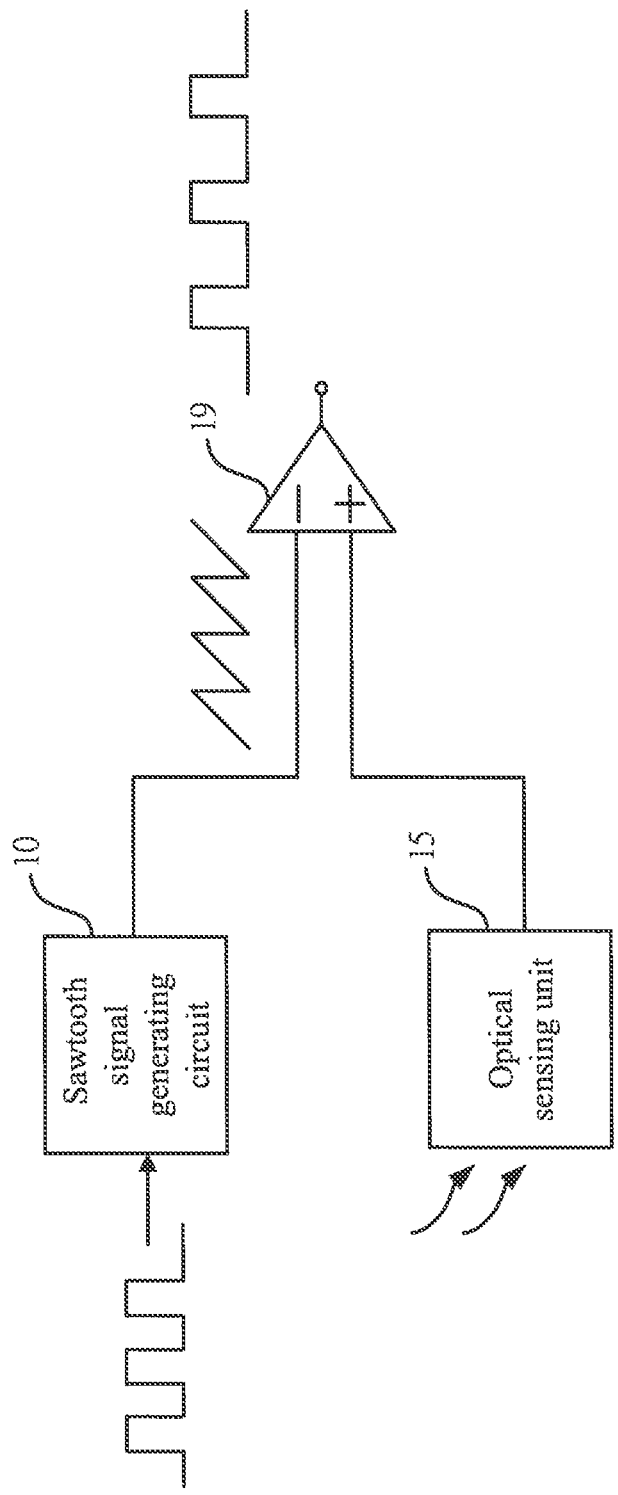
FIG. 1 shows a block diagram of an ambient light sensing module according to an embodiment of the present invention.

FIG. 1 shows a block diagram of an ambient light sensing module according to an embodiment of the present invention. As shown in the figure, the ambient light sensing module according to the present invention comprises a sawtooth signal generating circuit 10, an optical sensing unit 15, and a comparing unit 19. The optical sensing unit 15 is used for sensing the light intensity and producing a corresponding light-sensing signal. The characteristics of the light-sensing signal are related to the light intensity. For example, when the light intensity is high, the amplitude of the light-sensing signal is large. On the contrary, when the light intensity is weak, the amplitude of the light-sensing signal is low. The sawtooth signal generating circuit 10 is used for receiving an input signal for producing a sawtooth signal. An embodiment of the input signal is a PWM signal. According to an embodiment of the present invention, the frequency of the sawtooth signal is identical to the frequency of the input signal, and the slope of the sawtooth signal is proportional to the duty cycle of the input signal.

Refer again to FIG. 1. The comparing unit 19 produces the PWM signal, which is an output signal, according to the light-sensing signal and the sawtooth signal. The characteristics of the PWM signal are related to the light intensity. Thereby, the characteristics of the PWM signal represent the light intensity. The light-sensing signal according to the present embodiment is input to a positive input terminal of the comparing unit 19, while the sawtooth signal is input to a negative terminal of the comparing unit 19. Hence, when the level of the light-sensing signal is higher than that of the sawtooth signal, the level of the PWM signal is high. Accordingly, when the light intensity is high, the pulse width of the PWM signal gets wider, which means the duty cycle is longer. On the contrary, when the light intensity is low, the pulse width of the PWM signal is narrower, which means the duty cycle is shorter.

Because the PWM signal can be used as the control signal of the electronic device, it can be used for controlling the back-stage circuitry of the electronic device directly. For example, the PWM signal can control the light source of the backlight module of the electronic device directly for adjusting the intensity of the light source. Thereby, after the ambient light sensing module senses the intensity of the light source, the PWM signal can be produced for controlling the back-stage circuits of the electronic device, and hence increasing the performance of the electronic device as well as lowering the processing loading of the electronic device and the costs of disposing circuits.

Figure 2:
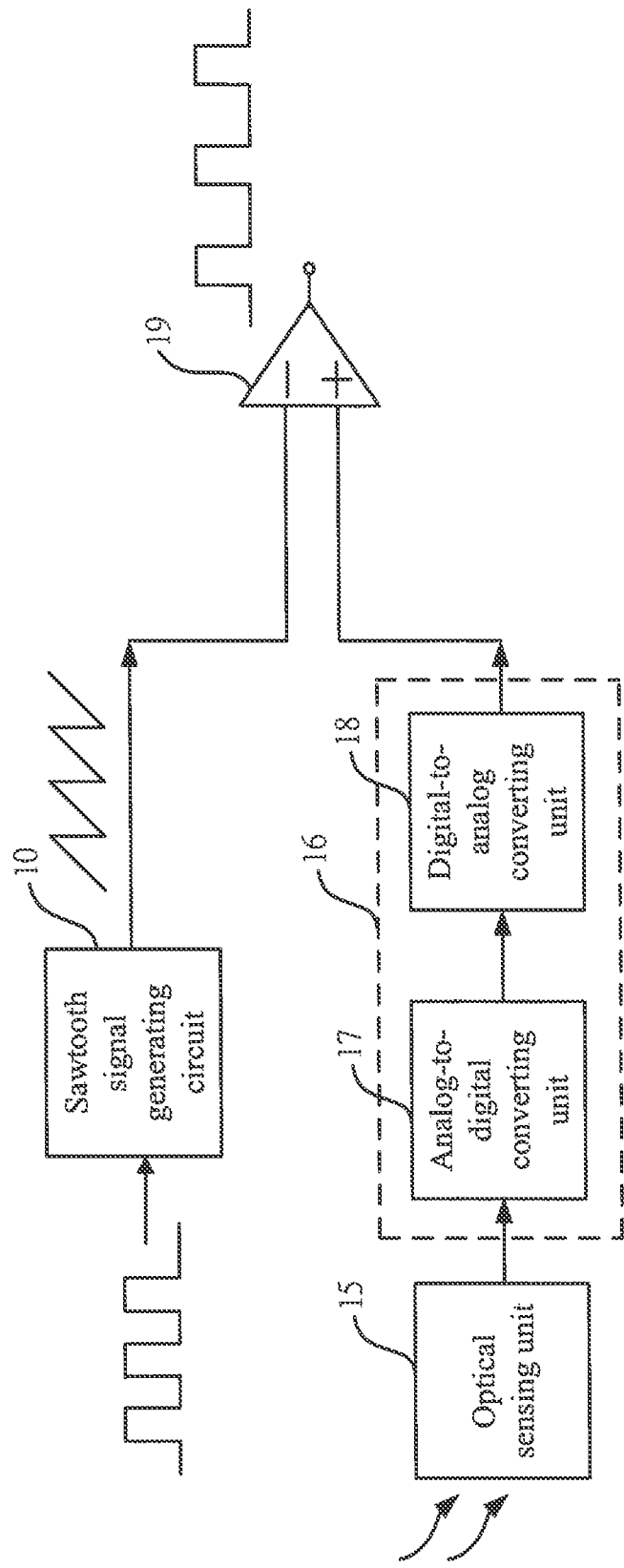
FIG. 2 shows a block diagram of an ambient light sensing module according to another embodiment of the present invention.

FIG. 2 shows a block diagram of an ambient light sensing module according to another embodiment of the present invention. As shown in the figure, the ambient light sensing module according to the present embodiment further comprises a signal processing unit 16, which receives the light-sensing signal for processing it and producing a converting signal. The comparing unit 19 receives the converting signal for comparing the comparing signal with the sawtooth signal and produces the PWM signal. Because the signal processing unit 16 produces the converting signal according to the light-sensing signal, the characteristics of the converting signal is related to those of the light-sensing signal. Consequently, the comparing unit 19 according to the present embodiment still produces the PWM signal according to the light-sensing signal and the sawtooth signal.

The signal processing unit 16 comprises an analog-to-digital converting unit 17 and a digital-to-analog converting unit 18. The analog-to-digital converting unit 17 receives the light-sensing signal and converts it to a digital signal. The digital-to-analog converting unit 18 receives the digital signal and converts it to an analog signal, which is the converting signal described above. The comparing unit 19 compares the analog signal with the sawtooth signal and produces the PWM signal. According to another embodiment of the present invention, the signal processing unit 16 need not to have the digital-to-analog converting unit 18; the digital signal of the analog-to-digital converting unit 17 is the converting signal described above for the comparing unit 19, which produces the PWM signal according to the digital signal and the sawtooth signal. Before the comparing unit 19 compares the digital with the sawtooth signal, it will convert the sawtooth signal into the digital format, which is then compared with the digital signal output by the analog-to-digital converting unit 17 for producing the PWM signal. Because the method of converting the sawtooth signal into the digital format is known to a person having ordinary skill in the art, it will not be described in more details here.

Figure 3:
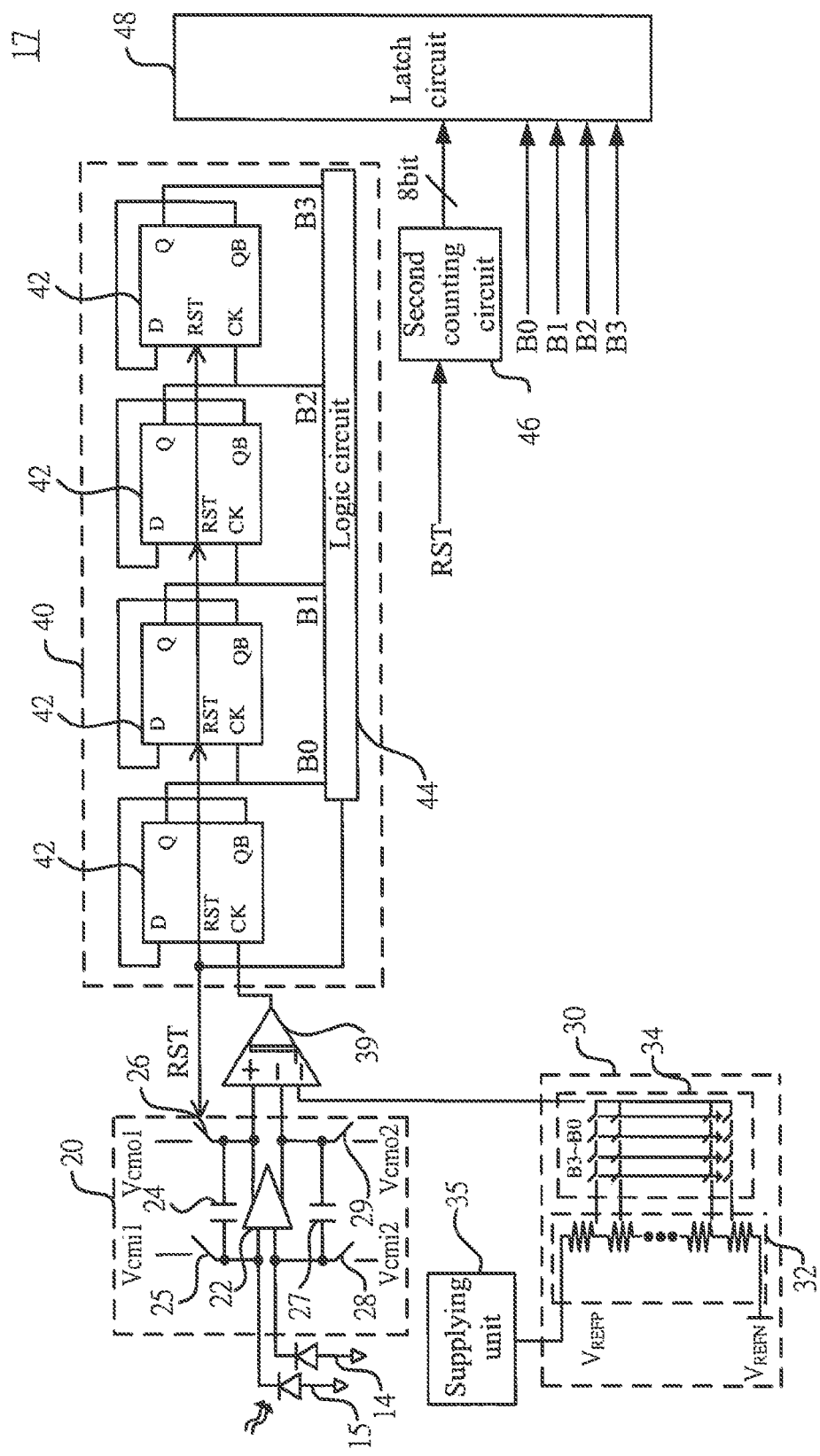
FIG. 3 shows a circuit diagram of an analog-to-digital converting unit according to an embodiment of the present invention.
Figure 4:
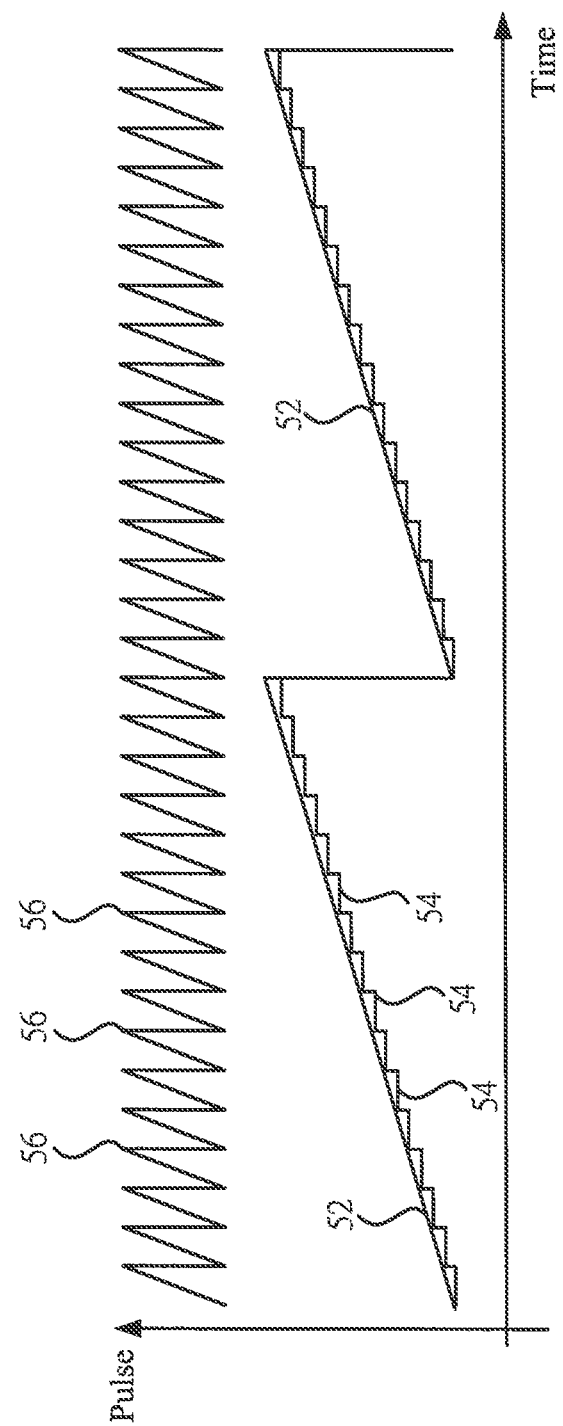
FIG. 4 shows waveforms of an analog-to-digital converting unit according to an embodiment of the present invention.

FIG. 3 and FIG. 4 show a circuit diagram and waveforms of the analog-to-digital converting unit according to an embodiment of the present invention, respectively. As shown in the figures, the analog-to-digital converting unit 17 according to the present invention comprises an integration circuit 20, a reference signal generating circuit 30, a supplying unit 35, a comparing unit 39, a first counting circuit 40, a second counting circuit 46, and a latch circuit 48. The integration circuit 20 receives and integrates the light-sensing signal of the optical sensing unit 15 and produces an integration signal 52 as shown in FIG. 4. The reference signal generating circuit 30 produces a plurality of reference signals sequentially. A positive input terminal and a negative input terminal of the comparing unit 39 receives the integration signal 52 produced by the integration circuit 20 and the plurality of reference signals produced by the reference signal generating circuit 30, and comparing the integration signal 52 with the plurality of reference signals sequentially for producing a plurality of comparing signal. According to an embodiment of the present invention, the comparing unit 39 of the analog-to-digital converting unit 17 is a hysteresis comparing unit.

Refer again to FIG. 3. The first counting circuit 40 is coupled to the output terminal of the comparing unit 39 for receiving and counting the plurality of reference signals produced by the comparing unit 39. When the first counting circuit 40 counts the plurality of comparing signal to a threshold value, it produces a reset signal RST for resetting the integration circuit 20. The integration circuit 20 is reset once by the first counting circuit 40 after the comparing unit 39 compares the integration signal with the plurality of reference signals and produces the plurality of comparing signals. Thereby, the number of times the integration circuit 20 is reset is reduced, which can lower the nonlinear errors of the integration circuit 20 and hence increasing the accuracy of the analog-to-digital converting unit 17.

Moreover, the analog-to-digital converting unit 17 according to the present invention further comprises an operational amplifier 22, a capacitor 24, a first discharging switch 25, and a second discharging switch 26. An input terminal of the operational amplifier 22 is coupled to the optical sensing unit 15 and receives the light-sensing signal. The capacitor 24 is connected in parallel with the operational amplifier 22 for producing the integration signal 52. When the light-sensing signal is input to the integration circuit 20, the integration circuit 20 will integrate the light-sensing signal and produce the integration signal 52. As shown in FIG. 4, the integration signal 52 of the analog-to-digital converting unit 17 according to the present invention is a triangle-wave signal. The first discharging switch 25 is coupled between a terminal of the capacitor 24 and a first discharge terminal $V_{cmi1}$ and is controlled by the reset signal RST of the first counting circuit 40. The second discharging switch 26 is coupled between the other terminal of the capacitor 24 and a second discharge terminal $V_{cmo1}$ and is also controlled by the reset signal RST of the first counting circuit 40. The reset signal RST is used for turning on the first and the second discharging switches 25, 26 for discharging the capacitor 24 and hence resetting the integration circuit 20. Accordingly, the integration circuit 20 will re-integrate the light-sensing signal and produce the next integration signal 52, namely, the next triangle-wave signal. Refer again to FIG. 3. The reference signal generating circuit 30 of the analog-to-digital converting unit 17 according to the present invention further comprises a voltage-dividing circuit 32 and a switch module 34. Both terminals of the voltage-dividing circuit 32 receive a reference voltage $V_{REFP}$ and a reference level $V_{REFN}$, respectively. The reference voltage $V_{REFP}$ is provided by the supplying unit 35. Thereby, the voltage level of the reference voltage $V_{REFP}$ is determined by the supplying unit 35. The voltage-dividing circuit 32 includes a plurality of resistors, which are connected in series with each other for dividing the reference voltage $V_{REFP}$ for producing a plurality of reference signals 54 with different levels as shown in FIG. 4. The levels of the plurality of reference signals 54 are increased gradually. The switch module 34 is coupled between the voltage-dividing circuit 32 and the comparing unit 39 for transmitting the plurality of reference signal 54 with different levels sequentially to the comparing unit 39, which compares the integration signal 52 with the plurality of reference signals 54 and produces a plurality of comparing signals.

When the level of the integration signal 52 is greater than the level of a reference signal 54 provided by the reference signal generating circuit 30, the switch module 34 will switch and transmit the next reference signal 54 having a higher level to the comparing unit 39. Because the level of the integration signal 52 will increase gradually, the comparing unit 39 compares the integration signal 52 with the plurality of reference signals 54 will produce the plurality of comparing signals.

The reference signal generating circuit 30 provides the reference signals 54 having different levels to the comparing unit 39 for comparing with the integration signal 52, each comparing signal produced by the comparing unit 39 is equivalent to a small triangle-wave signal 56. Thereby, counting the number of the plurality of comparing signals by the first counting circuit 40 is equivalent to counting the number of triangle-wave signals 56. The switch module 34 according to the present invention is controlled by the first counting circuit 40, which controls the switch module 34 to switch every time a comparing signal is counted for transmitting the reference signals 54 having different levels to the comparing unit 39. The switch module 34 includes a plurality of switches coupled between the plurality of resistors of the voltage-dividing circuit 32 and the comparing unit, respectively for providing the reference signals 54 having different levels to the comparing unit 39. The plurality of switches are controlled by the first counting circuit 40.

Refer again to FIG. 3. The first counting circuit 40 of the analog-to-digital converting unit 17 according to the present invention includes a counter and a logic circuit 44. According to the present embodiment, the counter includes a plurality of flip-flops 42, which are connected in series with each other. In the present embodiment, the plurality of flip-flops 42 are D-type flip-flops. An input terminal D of each flip-flop 42 is coupled with an inverted output terminal QB. A clock input terminal CK of the first flip-flop in the plurality of flip-flops 42 is coupled to the output terminal of the comparing unit 39 for receiving the comparing signal. In addition, except for the last flip-flop in the plurality of flip-flops 42, an output terminal Q of every flip-flop 42 is coupled to a clock input terminal CK of the next flip-flop 42, and thus forming connection in series. The output terminals Q of the plurality of flip-flops 42 output, respectively, the first counting signals B0~B3, which are binary. The counters used for counting the number of the comparing signals described above is equivalent to counting the number of the triangle-wave signals 56 and outputting the plurality of first counting signals B0~B3 correspondingly. The plurality of first counting signals B0~B3 can be used as the control signals for controlling the switch module 34 and for controlling the plurality of switches of the switch module 34. Thereby, the reference signals 54 having different levels can be transmitted to the comparing unit 39. The counter according to the present embodiment is embodied by the plurality of flip-flops 42. Nevertheless, the counter of the first counting circuit 40 is not limited to being composed of the plurality of flip-flops 42. A person having ordinary skill in the art can know the counter can also be composed by other commonly used circuits.

The logic circuit 44 is coupled to the counter for receiving the plurality of first counting signals B0~B3 and gives the number of the triangle-wave signals 56 according to the plurality of first counting signals B0~B3. When the logic circuit 44 knows the number of triangle-wave signals reaches the threshold value according to the plurality of first counting signals B0~B3, it produces the reset signal RST to reset the integration circuit 20 for re-integrating the light-sensing signal to produce the next new integration signal 52. In other words, the next big triangle-wave signal is produced. The threshold value according to the present embodiment is pre-configured in the logic circuit 44. Its value can be changed depending on requirements. Besides, the reset signal RST will also reset the counter in the first counting circuit 40. In the present embodiment, the reset signal RST is used for resetting the plurality of flip-flops 42 in order to re-count the plurality of comparing signals output by the comparing unit 39.

It is known from the above that the first counting circuit 40 is used for counting the number of the plurality of comparing signals, namely, the number of small triangle-wave signals 56. When the number of the comparing signal reaches the threshold value, the integration signal 52 is reset for producing the next integration signal and resetting the plurality of first counting signals B0~B3. Thereby, each integration signal 52 contains equivalently a fixed number of small triangle-wave signals 56.

Referring again to FIG. 3, the analog-to-digital converting unit 17 according to the present invention further comprises a second counting circuit 46 and a latch circuit 48. The second counting circuit 46 receives the reset signal RST produced by the first counting circuit 40 and counts the rest signal RST for producing a second counting signal and transmitting it to the latch circuit 48. The second counting signal produced by the second counting signal 46 represents the number of the integration signals 52, namely, the number of big triangle-wave signals produced by the integration circuit 20. The latch circuit 48 is further coupled to the first counting circuit 40 for receiving the plurality of counting signals B0~B3. Thereby, the latch circuit 48 can know the number of the integration signals 52 as well as the number of the small triangle-wave signals 56 contained in the integration signal 52 according to the plurality of first counting signals B0~B3 of the first counting circuit 40 and the second counting signal of the second counting circuit 46. That is to say, the total number of the small triangle-wave signals 56 is the product of the number of the integration signals 52 and the number of the small triangle-wave signals 56 contained in the integration signal 52. The latch circuit 48 produces the digital signal according to the plurality of first counting signals B0~B3 of the first counting circuit 40 and the second counting signal of the second counting circuit 46.

By applying the analog-to-digital converting unit 17 according to the present invention, the number of times the integration circuit 20 is reset is reduced, which can lower the nonlinear errors and hence increasing the accuracy of the analog-to-digital converting unit 17. Taking a 12-bit analog-to-digital converting unit according to the prior art for example, it needs to be reset for 4096 times. Nonetheless, the integration circuit 20 according to the present invention needs not to be reset for 4096 times. Provided the reference signal generating circuit 30 according to the present invention can provide the reference signals 54 with 16 different levels, which means that an integration signal 52 can contain 16 small triangle-wave signals 56 correspondingly. Thereby, the first counting circuit 40 can be a 4-bit counting circuit. Then the second counting circuit 46 can be design as a bit-bit counting circuit for counting the number of the integration signals 52. In this way, the 12-bit effect can be achieved. In other words, the integration circuit 20 according to the present invention needs to be rest for only 256 times, which is only ¹/₁₆ of the reset times for the analog-to-digital converting unit according to the prior art. Accordingly, the number of times the integration circuit 20 is reset is reduced effectively, which lowers the nonlinear errors and hence increasing the accuracy of the analog-to-digital converting unit 17. The 4-bit counting circuit of the first counting circuit 40, the 8-bit counting circuit of the second counting circuit 46, and the 12-bit latch circuit of the latch circuit 48 described above are only an embodiment of the present invention. The first counting circuit 40, the second counting circuit 46, and the latch circuit 48 can be designed according to requirements and are not limited to the embodiment described above.

According to FIG. 3, the integration circuit 20 according to the present invention can further comprises a reference optical sensing unit 14, a capacitor 27, a third discharging switch 28, and a fourth discharging switch 29. The reference optical sensing unit 14 is coupled to the input terminal of the operational amplifier 22. The capacitor 27 is connected in parallel with the operational amplifier 22. The third discharging switch 28 is coupled between a terminal of the capacitor 27 and a third discharge terminal $V_{cmi2}$ and is controlled by the reset signal RST of the first counting circuit 40. The fourth discharging switch 29 is coupled between the other terminal of the capacitor 27 and a fourth discharge terminal $V_{cmo2}$ and is also controlled by the reset signal RST of the first counting circuit 40. The reset signal RST is used for turning on the third and the fourth discharging switches 28, 29 for discharging the capacitor 27.

Theoretically, under the circumstance of no light source, the optical sensing unit will not sense any light and should not produce any signal. Nevertheless, in practice, when the optical sensing unit senses no light, it still may produce a low-level light-sensing signal. Thereby, the integration circuit 20 according to the present invention produces a baseline signal by using the reference optical sensing unit 14 under a no light source and fully dark condition. Then use the operational amplifier 22 and the capacitor 27 to integrate the baseline signal for producing a reference integration signal, which is a second integration signal. The integration signal produced by the capacitor 24 is a first integration signal. The first integration of the capacitor 24 and the second integration signal of the second capacitor 27 are transmitted to the comparing unit 39, which first compares the first and the second integration signals. Then it compares a difference value between the first and the second integration signals with the plurality of reference signals of the reference signal generating circuit 30 for producing sequentially a plurality of comparing signals. Because the analog-to-digital converting unit 17 uses the baseline signal of the optical sensing unit 14 as the basis for processing the light-sensing signal of the optical sensing unit, the accuracy of the analog-to-digital converting unit 17 can be enhanced.

Figure 5:
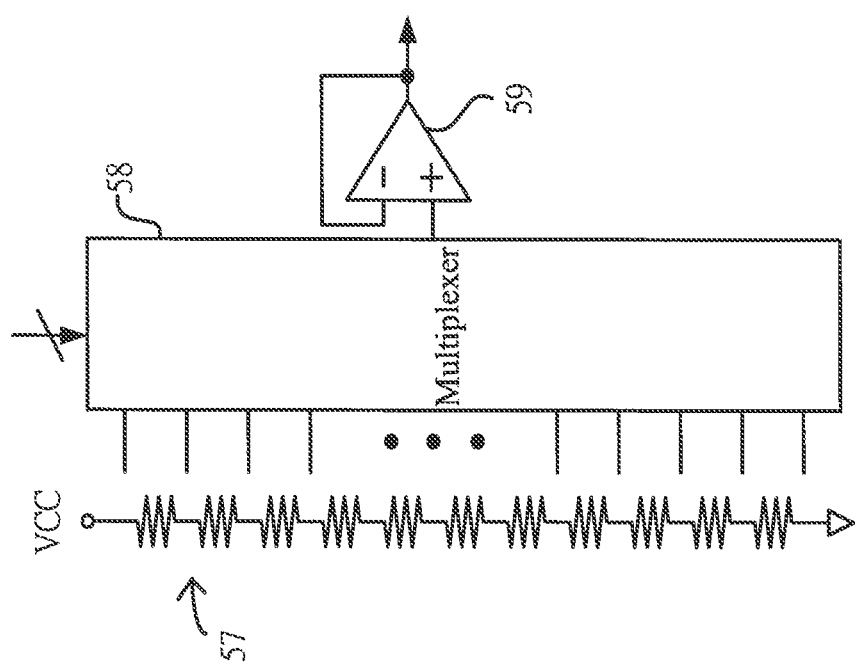
FIG. 5 shows a circuit diagram of a digital-to-analog converting unit according to an embodiment of the present invention.

FIG. 5 shows a circuit diagram of a digital-to-analog converting unit according to an embodiment of the present invention. As shown in the figure, the digital-to-analog converting unit 18 comprises a voltage source VCC, a voltage-dividing circuit 57, a multiplexer 58, and a buffer 59. The voltage source VCC is used for producing a supply voltage. The voltage-dividing circuit 57 is coupled to the voltage source VCC for receiving and voltage-dividing the supply voltage for producing a plurality of voltage signals. The voltage-dividing circuit 57 includes a plurality of resistors connected in series with each other. The multiplexer 58 is coupled between the voltage-dividing circuit 57 and the buffer 59. The multiplexer 58 receives the plurality of voltage signals and the digital signal produced by the analog-to-digital converting unit 17 (as shown in FIG. 2) and determines which of the plurality of voltage signals is to be output according to the digital signal. A positive input terminal of the buffer 59 is coupled to the output terminal of the multiplexer 58 for receiving the voltage signal; a negative input terminal of the buffer 59 is coupled to an output terminal of the buffer 59 for buffering the voltage signal output by the multiplexer 58 and outputting it as an analog signal.

Figure 6:
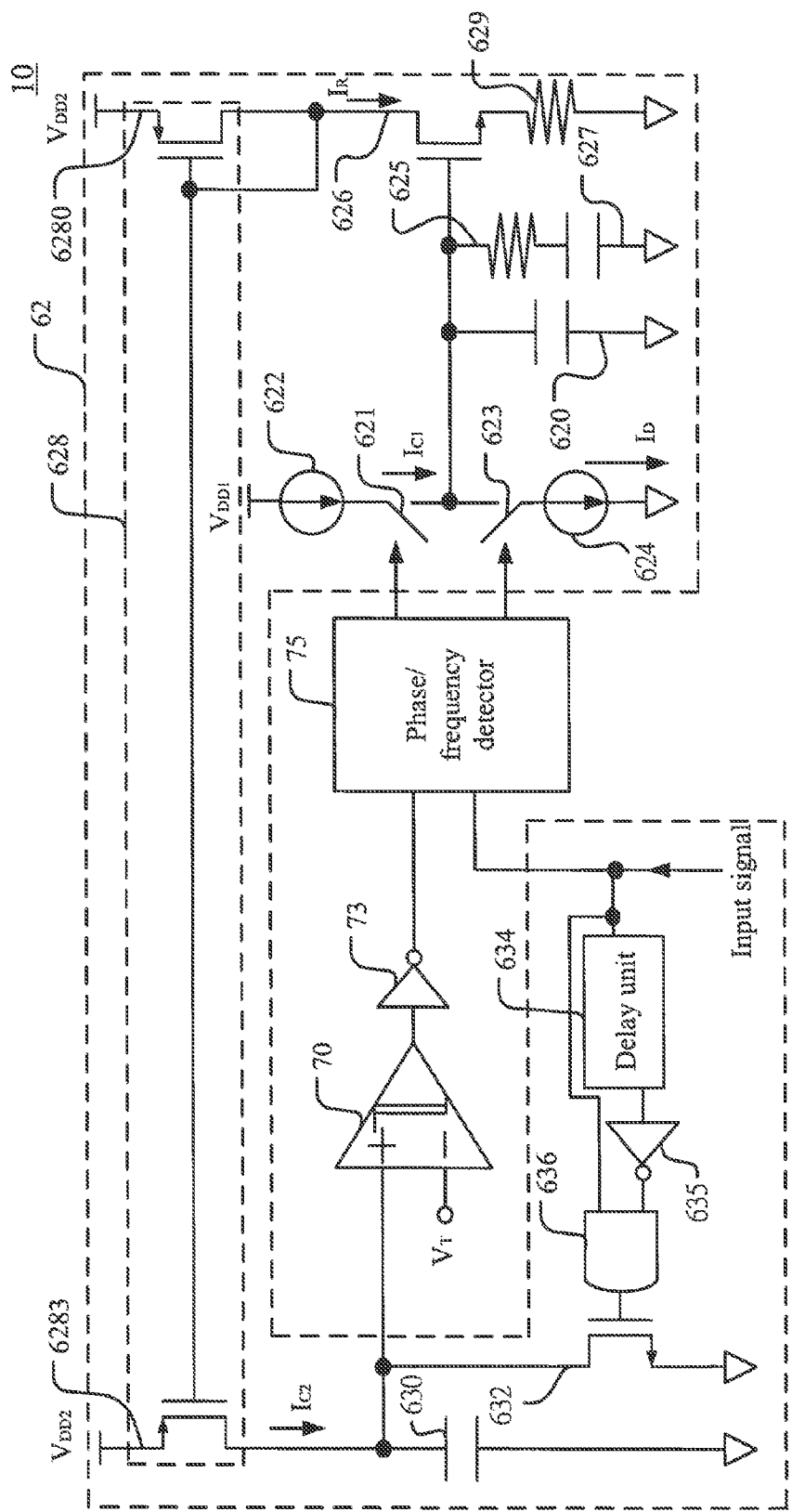
FIG. 6 shows a circuit diagram of a sawtooth signal generating circuit according to an embodiment of the present invention.

FIG. 6 shows a circuit diagram of a sawtooth signal generating circuit according to an embodiment of the present invention. As shown in the figure, the sawtooth signal generating circuit 10 comprises a generating 62, a comparing unit 70, and a phase/frequency detector (PFD) 75. The generator 62 is used for producing a sawtooth signal. The comparing unit 70 has a positive input terminal and a negative input terminal. The positive input terminal is coupled to the generator 62 for receiving the sawtooth signal. The negative input terminal of the comparing unit 70 receives a threshold signal $V_T$. The comparing unit 70 compares the sawtooth signal and the threshold signal $V_T$. An output signal of the comparing unit 70 produces a pulse signal via an inverter 73. Thereby, the comparing unit 70 is used for comparing the sawtooth signal and the threshold signal $V_T$ for producing the pulse signal. An embodiment of the comparing unit 70 is a hysteresis comparing unit. The inverter 73 is coupled between an output terminal of the comparing unit 70 and the PFD 75. The PFD 75 receives the input signal and the pulse signal and controls the generator 62 to produce the sawtooth signal according to the phases of the input signal and of the pulse signal for adjusting a slope of the sawtooth signal.

The generator 62 comprises a storage capacitor 620, a charging current source 622, a discharging current source 624, a first switch 626, a current mirror 628, an output capacitor 630, a second switch 632, a delay unit 634, and a logic unit 636. The storage capacitor 620 is used for producing a driving voltage for driving the first switch 626. The charging current source 622 is coupled between a voltage source $V_{DD1}$ and a terminal of a charging switch 621. The other terminal of the charging switch 622 is coupled to a terminal of the storage capacitor 620. The other terminal of the storage capacitor 620 is coupled to the ground. The charging current source 622 produces a first charging current $I_{C1}$, which charges the storage capacitor 620 via the charging switch 621 for producing the driving voltage. The discharging current source 624 is coupled between a terminal of a discharging switch 623 and the ground. The other terminal of the discharging switch 623 is coupled to the storage capacitor 620. The discharging current source 624 produces a discharging current $I_D$ for discharging the storage capacitor 620.

Refer again to FIG. 6. A gate of the first switch 626 is coupled to the storage capacitor 620 and controlled by the driving voltage produced by the storage capacitor 620. A terminal of a filtering resistor 625 is coupled to the storage capacitor 625 and the gate of the first switch 626. A filtering capacitor 627 is coupled between the other terminal of the filtering resistor 625 and the ground. The storage capacitor 620, the filtering resistor 625, and the filtering capacitor 627 form a loop filter. A resistor 629 is coupled between a source of the first switch 626 and the ground. When the first switch 626 is turned on by the driving voltage, a drain of the first switch 626 produces a reference current $I_R$, whose amplitude is determined by the resistance of the resistor 629.

The current mirror 628 is coupled to the first switch 626 and receives the reference current $I_R$. The current mirror 628 produces a second charging current $I_{C2}$ according to the reference current $I_R$. The second charging current $I_{C2}$ is proportional to the reference current $I_R$. In the present embodiment, the current mirror 628 includes two transistors 6280, 6283. A source of the transistor 6280 and a source of the transistor 6283 are both coupled to a voltage source $V_{DD2}$. A drain of the transistor 6280 is coupled to the drain of the first switch 626 for receiving the reference current $I_R$. A gate of the transistor 6280 and a gate of the transistor 6283 are coupled with each other. A drain of the transistor 6283 produces the second charging current $I_{C2}$. The output capacitor 630 is coupled to the current mirror 628 and the second switch 632, and is charged by the second charging current $I_{C2}$ produced by the current mirror 628 and discharged via the second switch 632 for producing the sawtooth signal. The output capacitor 630 is further coupled to the ground. A drain of the second switch 632 is coupled to the output capacitor 630; a drain of the second switch 632 is coupled to the ground.

The delay unit 634 receives and delays the input signal for producing a delay signal. An inverter 635 inverts the delay signal and transmits the delay signal to a first input terminal of the logic unit 636. A second input terminal of the logic unit 636 receives the input signal. The logic unit 636 produces a control signal according to the input signal and the inverted delay signal for controlling the second switch 632 to tune on of cut off. Namely, the logic unit 636 produces the control signal according to the input signal and the delay signal. According to the present embodiment, the logic unit 636 is an AND gate. The comparing unit 70 is coupled to the output capacitor 630 for receiving the sawtooth signal and comparing the sawtooth signal with the threshold signal for producing the pulse signal. The PFD 75 controls the charging switch 621 and the discharging switch 623 according to the phases of the input signal and of the pulse signal for determining whether to charge the storage capacitor 620 by the charging current source 622 or to discharge the storage capacitor 620 by the discharging current source 624.

FIG. 7A shows waveforms of signals of a sawtooth signal generating circuit according to an embodiment of the present invention. As shown in the figure, when the levels of the input signal and the delayed and inverted input signal are both high, the logic unit 636 produces the control signal with a high level to turn on the second switch 632 for discharging the output capacitor 630. At this moment, the level of the sawtooth signal is low. After the delay time of the delay unit 634, the level of the delayed and inverted input signal is low. Thereby, the level of the control signal is low, and hence cutting of the second switch 632. At this time, the second charging current $I_{C2}$ charges the output capacitor 630. The level of the sawtooth signal increases from a low level gradually until the control signal turns on the second switch 632. According to the present invention, the comparing unit 70 compares the sawtooth signal with the threshold signal for producing the pulse signal. The PFD 75 detects the pulse signal and the input signal, and judges if the slope of the sawtooth signal is the target value according to the phases of the pulse signal and of the input signal. If the phases are identical, it means that the slope of the sawtooth signal is the target value.

Figure 7B:
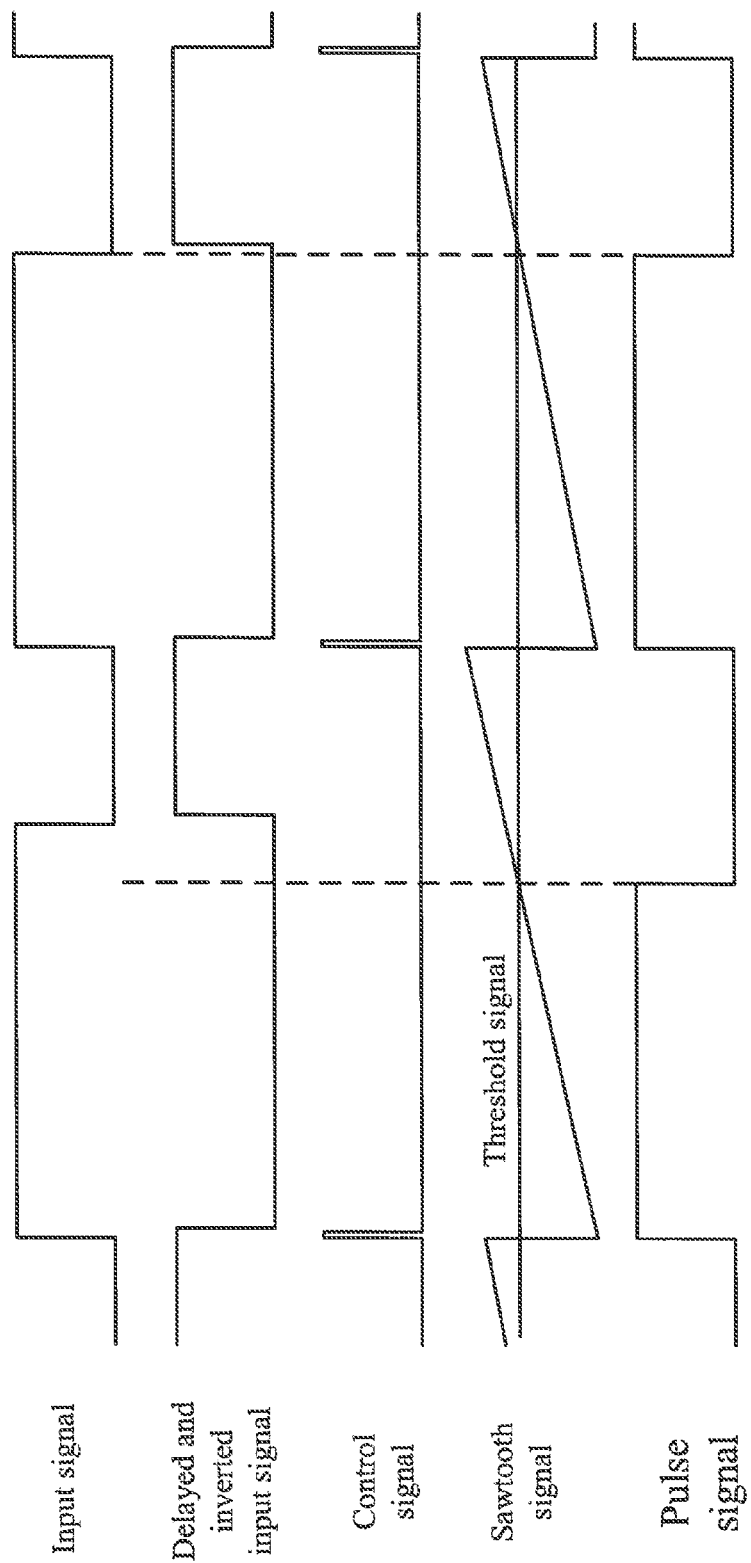

If the phase of the pulse signal is different from the phase of the input signal, it means that the slope of the sawtooth signal is not the target value and needs to be adjusted. As shown in FIG. 7B, the phase of the pulse signal leads that of the input signal, which means that the reference current $I_R$ is too large, making the second charging current $I_{C2}$ charge the output capacitor 630 so rapidly that the slope of the sawtooth signal is too steep. When the PFD 75 judges that the phase of the pulse signal leads that of the input signal, it controls the discharging switch 623 to turn on for making the discharging current source 624 discharge the storage capacitor 620 and thus lowering the reference current $I_R$, which will, in turn, lower the second charging current $I_{C2}$ for reducing the slope of the sawtooth signal. Thereby, in the next cycle, the slope of the sawtooth signal will meet the target value and the phase of the pulse signal will be equal to the phase of the input signal. Likewise, when the phase of the pulse signal lags that of the input signal, the PFD 75 controls the charging switch 621 to turn on for charging the storage capacitor 620 if the charging current source 622. Consequently, the reference current $I_R$ is raised and the second charging current $I_{C2}$ is increased accordingly for increasing the slope of the sawtooth signal.

Figure 8:
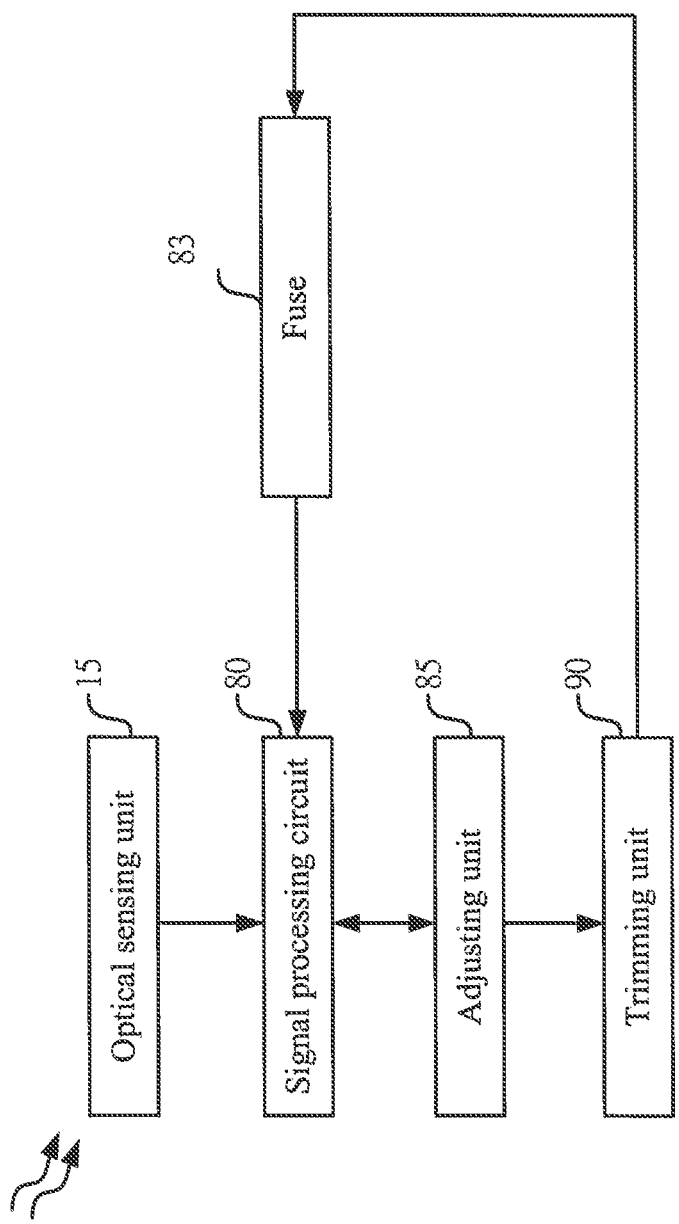
FIG. 8 shows a block diagram of an ambient light sensing module according to a third embodiment of the present invention.

FIG. 8 shows a block diagram of an ambient light sensing module according to a third embodiment of the present invention. As shown in the figure, the ambient light sensing module according to the present embodiment comprises the optical sensing unit 15, a signal processing circuit 80, at least a fuse 83, an adjusting circuit 85, and a trimming unit 90. The signal processing circuit 80 comprises the sawtooth generating circuit 10, the signal processing unit 16, and the comparing unit 19 as described above (as shown in FIG. 2) for processing the light-sensing signal of the optical sensing unit 15. In addition, the signal processing circuit 80 can also be a normal processing circuit, not limited to the sawtooth generating circuit 10, the signal processing unit 16, and the comparing unit 19 according to the present invention. The fuse 83 is used for determining a processing parameter, such as the gain, of the signal processing circuit 80. The signal processing circuit 80 processes the light-sensing signal according to the processing parameter. Thereby, the processing parameter will determine the characteristics of the signal processing circuit 80.

According to an embodiment of the present invention, the processing parameter determined by the fuse 83 will be stored in a register (not shown in the figure) of the signal processing circuit 80. The processing parameters can be stored in any register inside the electronic device as well. The processing parameter will be transmitted to the supplying unit 35 of the analog-to-digital converting unit 17 in FIG. 3. The supplying unit 35 will provide the reference voltage according to the processing parameter. In other words, the level of the reference voltage is determined by the processing parameter. The level of the reference voltage influences the levels of the plurality of reference signals produced by dividing the reference voltage by the voltage-dividing circuit 32, and hence determining the characteristics of the analog-to-digital converting unit 17. Thereby, by modifying the processing parameter, the characteristics of the analog-to-digital converting unit 17, and hence of the signal processing circuit 80, are adjusted. The signal processing circuit 80 processes the same light-sensing signal according to different processing parameters produces output signals with different characteristics. For example, the analog-to-digital converting unit 17 processes the same light-sensing signal according to different processing parameters will produce digital signals having different values. By changing the digital signal using the processing parameter, the analog signal of the digital-to-analog converting unit 18 (as shown in FIG. 2) and the PWM signal produced by the comparing unit 19 (as shown in FIG. 2) will be changed.

While adjusting the ambient light sensing module of the present invention, a light source with a predetermined intensity can be used for illuminating the ambient light sensing module so that the optical sensing unit 15 can sense the light source and produce the corresponding light-sensing signal. The signal processing circuit 80 can process the light-sensing signal according to the predetermined processing parameter and produce the output signal, which is a digital signal, an analog signal, or a PWM signal. The adjusting unit 85 receives the output signal and judges if the processing parameter needs to be modified according to the predetermined light intensity and the characteristics of the output signal. The adjusting unit 85 has a look-up table, which stores the predetermined light intensity and a corresponding target value. The target value represents the characteristic of the signal, such as the value of the digital signal, the amplitude of the analog signal, or the duty cycle of the PWM signal. The adjusting unit 85 judges if the processing parameter needs to be modified according to the target value and the output signal. If the characteristic of the output signal differs from the target value, it means that the processing parameter needs to be modified. Then, the adjusting unit 85 will produce an adjusting signal and transmits the adjusting signal to the trimming unit 90 for controlling the trimming unit 90 to trim the fuse 83. Thereby, the processing parameter can be modified. According to an embodiment of the present invention, the fuse 83 is a laser fuse, and the trimming unit 90 is a laser unit.

The present invention further provides a method for modifying the processing parameter. The adjusting unit 85 produces a plurality of testing parameters according to the output signal and the predetermined light intensity. One of the plurality of testing parameters is registered in the register for replacing the processing parameter therein. The signal processing circuit 80 will process the light-sensing signal according to the testing parameter stored in the register and produce a digital signal, an analog signal, or a PWM signal as a reference signal. Afterwards, another testing parameter is registered in the register for replacing the original testing parameter therein. The signal processing circuit 80 will process the same light-sensing signal according to the testing parameter newly stored in the register and produce another reference signal.

It is known from the above that the plurality of testing parameters produced by the adjusting unit 85 will be provided sequentially to the signal processing circuit 80, which will process the same light-sensing signal according to the plurality of testing parameters and produce a plurality of reference signals sequentially. The adjusting unit 85 will then produce the adjusting signal according to the plurality of reference signals and the predetermined light intensity. The adjusting unit 85 compares the corresponding target value of the predetermined light intensity with the characteristics of the plurality of reference signals for choosing the reference signal closest to the target value. The corresponding testing parameter of this reference signal closest to the target value is just the most suitable parameter. The adjusting unit 85 will produce the adjusting signal according to the corresponding testing parameter of the reference signal closest to the target value and transmit the adjusting signal to the trimming unit 90 for controlling the trimming unit 90 to trim the fuse 83 and thus modifying the processing parameter. Thereby, the modified processing parameter will be identical to the most suitable parameter found above.

To sum up, the ambient light sensing module provided by the present invention comprises a sawtooth signal generating circuit, an optical sensing unit, and a comparing unit. The sawtooth signal generating circuit produces a sawtooth signal. The optical sensing unit senses a light source and produces a light-sensing signal. The comparing unit produces a PWM signal related to the intensity of the light source according to the light-sensing signal and the sawtooth signal. The PWM signal can be used as the control signal of the electronic device for controlling the back-stage circuitry of the electronic device. The ambient light sensing module further comprises at least a fuse, a signal processing unit, and an adjusting unit. The fuse is used for determining a processing parameter of the signal processing unit. The signal processing unit processes the light-sensing signal according to the processing parameter for outputting a converting signal. The comparing unit compares the converting signal with the sawtooth signal for producing the PWM signal. The adjusting unit produces an adjusting signal according to the PWM signal and the light intensity or according to the converting signal and the light intensity for controlling a trimming unit to trim the fuse and thus modifying the processing parameter.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An ambient light sensing module with a signal generation function, comprising:
   a sawtooth signal generating circuit, producing a sawtooth signal;
   an optical sensing unit, sensing a light source, and producing a light-sensing signal; and
   a comparing unit, producing a pulse-width modulation signal related to the intensity of said light source according to said light-sensing signal and said sawtooth signal;
   wherein said sawtooth signal generating circuit comprises
      a generator for producing said sawtooth signal, said generator comprises:
      a storage capacitor, used for producing a driving voltage;
      a charging current source, producing a first charging current for charging said storage capacitor and producing said driving voltage;
      a discharging current source, producing a discharging current for discharging said storage capacitor;
      a first switch, coupled to said storage capacitor, controlled by said driving voltage, and producing a reference current;
      a current mirror, producing a second charging current according to said reference current;
      an output capacitor, coupled to said current mirror, producing said sawtooth signal, and said second charging current charging said output capacitor for producing said sawtooth signal;
      a second switch, coupled between said output capacitor and the ground for discharging said output capacitor;
      a delay unit, delaying an input signal for producing a delay signal; and
      a logic unit, producing a control signal according to said input signal and said delay signal for controlling said second switch;
      where a phase/frequency detector controls said charging current source and said discharging current source according to a phase of said input signal and a phase of a pulse signal.

2. The ambient light sensing module of claim 1, wherein said sawtooth signal generating circuit further comprises:
   a comparing unit, comparing said sawtooth signal with a threshold signal for producing said pulse signal; and
   said phase/frequency detector, receiving said input signal and said pulse signal, and controlling said generator to produce said sawtooth signal for adjusting a slope of said sawtooth signal according to said phase of said input signal and said phase of said pulse signal.

3. The ambient light sensing module of claim 1, and further comprising an analog-to-digital converting unit, receiving said light-sensing signal, converting said light-sensing signal to a digital signal, and said comparing unit producing said pulse-width modulation signal according to said digital signal and said sawtooth signal.

4. The ambient light sensing module of claim 1, and further comprising:
   an analog-to-digital converting unit, receiving said light-sensing signal, and converting said light-sensing signal to a digital signal; and
   a digital-to-analog converting unit, receiving said digital signal, converting said digital signal to an analog signal, and said comparing unit producing said pulse-width modulation signal according to said analog signal and said sawtooth signal.

5. The ambient light sensing module of claim 3 or 4, wherein said analog-to-digital converting unit comprises:
   an integration circuit, integrating said light-sensing signal for producing an integration signal;
   a reference signal generating circuit, producing a plurality of reference signals sequentially;
   a comparing unit, receiving said integration signal and said plurality of reference signals, and comparing said integration signal with said plurality of reference signals sequentially for producing a plurality of comparing signals sequentially;
   a first counting circuit, receiving said plurality of comparing signals, and counting said plurality of comparing signals for producing a first counting signal used for producing a reset signal and resetting said integrating circuit and said first counting circuit;
   a second counting circuit, coupled to said first counting circuit for counting the number of said reset signal and producing a second counting signal; and
   a latch circuit, receiving said first counting signal and said second counting signal for producing said digital signal.

6. The ambient light sensing module of claim 3 or 4, wherein said analog-to-digital converting unit comprises:
   an integration circuit, integrating said light-sensing signal for producing a first integration signal, and integrating a baseline signal for producing a second integration signal;
   a reference signal generating circuit, producing a plurality of reference signals sequentially;
   a comparing unit, comparing a difference value between said first integration signal and said second integration signal with said plurality of reference signals sequentially for producing a plurality of comparing signals sequentially;
   a first counting circuit, receiving said plurality of comparing signals, and counting said plurality of comparing signals for producing a first counting signal used for producing a reset signal and resetting said integrating circuit and said first counting circuit;
   a second counting circuit, coupled to said first counting circuit for counting the number of said reset signal and producing a second counting signal; and
   a latch circuit, receiving said first counting signal and said second counting signal for producing said digital signal.

7. The ambient light sensing module of claim 1, and further comprising:
   at least a fuse, determining a processing parameter;
   a signal processing unit, receiving said light-sensing signal, processing said light-sensing signal according to said processing parameter, outputting a converting signal, and said comparing unit comparing said converting signal with said sawtooth signal for producing said pulse-width modulation signal; and
   an adjusting unit, producing an adjusting signal according to said pulse-width modulation signal and the intensity of said light source or according to said converting signal and the intensity of said light source;
   where a trimming unit trims said fuse according to said adjusting signal for modifying said processing parameter.

8. The ambient light sensing module of claim 1, and further comprising:
   at least a fuse, determining a processing parameter;
   a signal processing unit, receiving said light-sensing signal, processing said light-sensing signal according to said processing parameter, outputting a converting signal, and said comparing unit comparing said converting signal with said sawtooth signal for producing said pulse-width modulation signal; and an adjusting unit, producing a plurality of testing parameters according to said pulse-width modulation signal and the intensity of said light source or according to said converting signal and the intensity of said light source;

where said signal processing unit processes said light-sensing signal according to said plurality of testing parameters, respectively, and produces a plurality of reference signals; said adjusting unit produces an adjusting signal according to said plurality of reference signals and the intensity of said light source; and a trimming unit trims said fuse according to said adjusting signal for modifying said processing parameter.

9. An ambient light sensing module with a signal generation function, comprising:
at least a fuse, determining a processing parameter;
an optical sensing unit, sensing a light source and producing a light-sensing signal;
a signal processing circuit, coupled to said optical sensing unit, and processing said light-sensing signal according to said processing parameter for producing a pulse-width modulation signal acting as an output signal; and
an adjusting unit, producing an adjusting signal according to said output signal and the intensity of said light source;
where a trimming unit trims said fuse according to said adjusting signal for modifying said processing parameter, and said signal processing circuit comprises a sawtooth signal generating circuit for producing a sawtooth signal, said sawtooth signal is utilized to produce said pulse-width modulation signal, said sawtooth signal generating circuit comprises a generator for producing said sawtooth signal, said generator comprises:
a storage capacitor, used for producing a driving voltage;
a charging current source, producing a first charging current for charging said storage capacitor and producing said driving voltage;
a discharging current source, producing a discharging current for discharging said storage capacitor;
a first switch, coupled to said storage capacitor, controlled by said driving voltage, and producing a reference current;
a current mirror, producing a second charging current according to said reference current;
an output capacitor, coupled to said current mirror, producing said sawtooth signal, and said second charging current charging said output capacitor for producing said sawtooth signal;
a second switch, coupled between said output capacitor and the ground for discharging said output capacitor;
a delay unit, delaying an input signal for producing a delay signal; and
a logic unit, producing a control signal according to said input signal and said delay signal for controlling said second switch;
where a phase/frequency detector controls said charging current source and said discharging current source according to a phase of said input signal and a phase of a pulse signal.

10. The ambient light sensing module of claim 9, wherein said signal processing circuit comprises an analog-to-digital converting unit, receiving said light-sensing signal, and converting said light-sensing signal to a digital signal according to said processing parameter.

11. The ambient light sensing module of claim 9, wherein said signal processing circuit comprises:

an analog-to-digital converting unit, receiving said light-sensing signal, and converting said light-sensing signal to a digital signal according to said processing parameter; and a digital-to-analog converting unit, receiving said digital signal, and converting said digital signal to an analog signal.

12. The ambient light sensing module of claim 10 or 11, wherein said analog-to-digital converting unit comprises:
an integration circuit, integrating said light-sensing signal for producing an integration signal;
a supplying unit, providing a reference voltage according to said processing parameter;
a reference signal generating circuit, producing a plurality of reference signals sequentially according to said reference voltage;
a comparing unit, receiving said integration signal and said plurality of reference signals, and comparing said integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

13. The ambient light sensing module of claim 10 or 11, wherein said analog-to-digital converting unit comprises:
an integration circuit, integrating said light-sensing signal for producing a first integration signal, and integrating a baseline signal for producing a second integration signal;
a supplying unit, providing a reference voltage according to said processing parameter;
a reference signal generating circuit, producing a plurality of reference signals sequentially according to said reference voltage;
a comparing unit, comparing a difference value between said first integration signal and said second integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

14. The ambient light sensing module of claim 9, wherein said signal processing circuit further comprises:
a comparing unit, comparing converting signal with said sawtooth signal for producing said pulse-width modulation signal;
where said signal processing circuit receives said light-sensing signal, processes said light-sensing signal according to said processing parameter, and generates said converting signal.

15. The ambient light sensing module of claim 14, wherein said sawtooth signal generating circuit further comprises:
a comparing unit, comparing said sawtooth signal with a threshold signal for producing said pulse signal; and
said phase/frequency detector, receiving said input signal and said pulse signal, and controlling said generator to produce said sawtooth signal for adjusting a slope of said sawtooth signal according to said phase of said input signal and said phase of said pulse signal.

16. The ambient light sensing module of claim 9, wherein said adjusting unit further comprises a look-up table, storing the intensity of said light source and a corresponding target value, and said adjusting unit producing said adjusting signal according to said target value and said output signal.

17. An ambient light sensing module with a signal generation function, comprising:
at least a fuse, determining a processing parameter;
an optical sensing unit, sensing a light source and producing a light-sensing signal;
a signal processing circuit, coupled to said optical sensing unit, and processing said light-sensing signal according to said processing parameter for outputting an output signal, said signal processing circuit comprising an analog-to-digital converting unit, said analog-to-digital converting unit receiving said light-sensing signal and converting said light-sensing signal to a digital signal acting as said output signal according to said processing parameter; and
an adjusting unit, producing a plurality of testing parameters according to said output signal and the intensity of said light source;
where said signal processing circuit processes said light-sensing signal according to said plurality of testing parameters, respectively, and produces a plurality of reference signals; said adjusting unit produces an adjusting signal according to said plurality of reference signals and the intensity of said light source; and a trimming unit trims said fuse according to said adjusting signal for modifying said processing parameter; said analog-to-digital converting unit comprises:
an integration circuit, integrating said light-sensing signal for producing an integration signal;
a supplying unit, providing a reference voltage according to said processing parameter;
a reference signal generating circuit, producing a plurality of reference signals sequentially according to said reference voltage;
a comparing unit, receiving said integration signal and said plurality of reference signals, and comparing said integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

18. An ambient light sensing module with a signal generation function, comprising:
at least a fuse, determining a processing parameter;
an optical sensing unit, sensing a light source and producing a light-sensing signal;
a signal processing circuit, coupled to said optical sensing unit, and processing said light-sensing signal according to said processing parameter for outputting an output signal, wherein said signal processing circuit comprises an analog-to-digital converting unit, receiving said light-sensing signal, and converting said light-sensing signal to a digital signal acting as said output signal according to said processing parameter; and
an adjusting unit, producing a plurality of testing parameters according to said output signal and the intensity of said light source;
where said signal processing circuit processes said light-sensing signal according to said plurality of testing parameters, respectively, and produces a plurality of reference signals; said adjusting unit produces an adjusting signal according to said plurality of reference signals and the intensity of said light source; and a trimming unit trims said fuse according to said adjusting signal for modifying said processing parameter; said analog-to-digital converting unit comprises:
an integration circuit, integrating said light-sensing signal for producing a first integration signal, and integrating a baseline signal for producing a second integration signal;
a supplying unit, providing a reference voltage according to said processing parameter;
a reference signal generating circuit, producing a plurality of reference signals sequentially according to said reference voltage;
a comparing unit, comparing a difference value between said first integration signal and said second integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

19. An ambient light sensing module with a signal generation function, comprising:
at least a fuse, determining a processing parameter;
an optical sensing unit, sensing a light source and producing a light-sensing signal;
a signal processing circuit, coupled to said optical sensing unit, and processing said light-sensing signal according to said processing parameter for outputting an output signal, wherein said signal processing circuit comprises:
an analog-to-digital converting unit, receiving said light-sensing signal, and converting said light-sensing signal to a digital signal according to said processing parameter; and
a digital-to-analog converting unit, receiving said digital signal, and converting said digital signal to an analog signal acting as said output signal;
an adjusting unit, producing a plurality of testing parameters according to said output signal and the intensity of said light source;

where said signal processing circuit processes said light-sensing signal according to said plurality of testing parameters, respectively, and produces a plurality of reference signals; said adjusting unit produces an adjusting signal according to said plurality of reference signals and the intensity of said light source; and a trimming unit trims said fuse according to said adjusting signal for modifying said processing parameter; said analog-to-digital converting unit comprises:
an integration circuit, integrating said light-sensing signal for producing an integration signal;
a supplying unit, providing a reference voltage according to said processing parameter;
a reference signal generating circuit, producing a plurality of reference signals sequentially according to said reference voltage;
a comparing unit, receiving said integration signal and said plurality of reference signals, and comparing said integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

20. An ambient light sensing module with a signal generation function, comprising:
at least a fuse, determining a processing parameter;
an optical sensing unit, sensing a light source and producing a light-sensing signal;
a signal processing circuit, coupled to said optical sensing unit, and processing said light-sensing signal according to said processing parameter for outputting an output signal, wherein said signal processing circuit comprises:
an analog-to-digital converting unit, receiving said light-sensing signal, and converting said light-sensing signal to a digital signal according to said processing parameter; and
a digital-to-analog converting unit, receiving said digital signal, and converting said digital signal to an analog signal for producing said output signal;
an adjusting unit, producing a plurality of testing parameters according to said output signal and the intensity of said light source;
where said signal processing circuit processes said light-sensing signal according to said plurality of testing parameters, respectively, and produces a plurality of reference signals; said adjusting unit produces an adjusting signal according to said plurality of reference signals and the intensity of said light source; and a trimming unit trims said fuse according to said adjusting signal for modifying said processing parameter, said analog-to-digital converting unit comprises:
an integration circuit, integrating said light-sensing signal for producing a first integration signal, and integrating a baseline signal for producing a second integration signal;
a supplying unit, providing a reference voltage according to said processing parameter;
a reference signal generating circuit, producing a plurality of reference signals sequentially according to said reference voltage;
a comparing unit, comparing a difference value between said first integration signal and said second integration signal with said plurality of reference signals sequentially for producing a plurality of comparing signals sequentially;
a first counting circuit, receiving said plurality of comparing signals, and counting said plurality of comparing signals for producing a first counting signal used for producing a reset signal and resetting said integrating circuit and said first counting circuit;
a second counting circuit, coupled to said first counting circuit for counting the number of said reset signal and producing a second counting signal; and
a latch circuit, receiving said first counting signal and said second counting signal for producing said digital signal.

21. The ambient light sensing module of claim 20, wherein said signal processing circuit processes said light-sensing signal for producing a pulse-width modulation signal acting as said output signal.

22. The ambient light sensing module of claim 21, wherein said signal processing circuit further comprises:
a sawtooth signal generating circuit, producing a sawtooth signal; and
a comparing unit, producing said pulse-width modulation signal according to said analog signal and said sawtooth signal.

23. The ambient light sensing module of claim 22, wherein said sawtooth signal generating circuit comprises:
a generator, producing said sawtooth signal;
a comparing unit, comparing said sawtooth signal with a threshold signal for producing a pulse signal; and
a phase/frequency detector, receiving an input signal and said pulse signal, and controlling said generator to produce said sawtooth signal for adjusting a slope of said sawtooth signal according to a phase of said input signal and a phase of said pulse signal.

24. The ambient light sensing module of claim 20, wherein said adjusting unit further comprises a look-up table, storing the intensity of said light source and a corresponding target value, and said adjusting unit producing said adjusting signal according to said target value and said output signal.

* * * * *